US012235546B2

(12) United States Patent
Yang et al.

(10) Patent No.: US 12,235,546 B2
(45) Date of Patent: Feb. 25, 2025

(54) DISPLAY MODULE, ASSEMBLY METHOD OF DISPLAY MODULE, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Haotian Yang, Beijing (CN); Inho Park, Beijing (CN); Seungyong Oh, Beijing (CN); Xiaoxia Liu, Beijing (CN); Kang Wang, Beijing (CN); Xiangdong Wei, Beijing (CN); Zheng Bao, Beijing (CN); Jiaming Shen, Beijing (CN); Miaomiao Song, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/696,094

(22) PCT Filed: Jul. 31, 2023

(86) PCT No.: PCT/CN2023/110361
§ 371 (c)(1),
(2) Date: Mar. 27, 2024

(87) PCT Pub. No.: WO2024/045986
PCT Pub. Date: Mar. 7, 2024

(65) Prior Publication Data
US 2024/0427198 A1    Dec. 26, 2024

(30) Foreign Application Priority Data
Aug. 31, 2022   (CN) .................. 202211068245.9

(51) Int. Cl.
*G09F 9/33*    (2006.01)
*G02F 1/13*    (2006.01)
(Continued)

(52) U.S. Cl.
CPC .... *G02F 1/13398* (2021.01); *G02F 1/133317* (2021.01); *G02F 1/133325* (2021.01); *G02F 1/133331* (2021.01); *H10K 59/8722* (2023.02)

(58) Field of Classification Search
CPC ........... G02F 1/13398; G02F 1/133317; G02F 1/133325; G02F 1/133331; H10K 59/8722
See application file for complete search history.

(56) References Cited

U.S. PATENT DOCUMENTS 11,561,422 B2 *   1/2023   Xu .......................... B60K 35/00
2017/0269285 A1   9/2017   Hirayama et al.
(Continued)

FOREIGN PATENT DOCUMENTS

| CN | 107633769 A | 1/2018 |
| CN | 108169954 A | 6/2018 |

(Continued)

*Primary Examiner* — Tracie Y Green
(74) *Attorney, Agent, or Firm* — WHDA, LLP

(57) ABSTRACT

A display module, an assembly method of the display module and a display apparatus are provided, which belongs to the technical field of displaying, and the display module includes: a cover plate, a side of which including a first area and a second area adjacently connected to the first area; a display panel attached to the first area; and a spacer attached to a part or all of the second area, a height of the spacer being greater than a height of the display panel. The spacer includes a housing and an injection cavity recessed into interior of the housing, the injection cavity is close to the display panel and the injection cavity is filled with an injection material; and a space cavity is provided at a side of (Continued)

the display panel close to the spacer, and the space cavity is filled with the injection material.

18 Claims, 6 Drawing Sheets

(51) Int. Cl.
  *G02F 1/1333* (2006.01)
  *G02F 1/1339* (2006.01)
  *G09F 9/35* (2006.01)
  *H10K 59/80* (2023.01)

(56) References Cited

U.S. PATENT DOCUMENTS

| | | | |
|---|---|---|---|
| 2019/0140207 A1* | 5/2019 | Li | H10K 59/8722 |
| 2024/0036384 A1* | 2/2024 | Huang | G02F 1/133528 |
| 2024/0276657 A1* | 8/2024 | Beau | B29C 65/70 |

FOREIGN PATENT DOCUMENTS

| | | | |
|---|---|---|---|
| CN | 108227269 A | 6/2018 |
| CN | 207833802 U | 9/2018 |
| CN | 109473039 A | 3/2019 |
| CN | 111968537 A | 11/2020 |
| CN | 216361894 U | 4/2022 |
| CN | 115331584 A | 11/2022 |
| WO | 2022/089022 A1 | 5/2022 |

* cited by examiner

DISPLAY MODULE, ASSEMBLY METHOD OF DISPLAY MODULE, AND DISPLAY APPARATUS

This application claims priority to the Chinese patent application No. 202211068245.9 entitled "DISPLAY MODULE, ASSEMBLY METHOD OF DISPLAY MODULE, AND DISPLAY APPARATUS" filed in China National Intellectual Property Administration on Aug. 31, 2022, which is incorporated herein by reference in their entirety.

TECHNICAL FIELD

The present disclosure relates to the technical field of displaying, in particular to a display module, an assembly method of the display module, and a display apparatus.

BACKGROUND

In a display apparatus, a display module is generally attached to a cover plate, and then the cover plate is connected to a middle frame, so that the middle frame supports the display module through the cover plate. However, because the display module is attached to a side of the cover plate, a certain distance needs to be kept for the middle frame from an edge of the display module when the middle frame is connected to the cover plate, so as to avoid interference with the display module. Therefore, a space for mounting the middle frame and a space for avoiding interference between the middle frame and the display module need to be reserved at the cover plate, which may increase a width of a border of the display apparatus.

SUMMARY

A display module is provided in the present disclosure, which includes:
   a cover plate, wherein a side of the cover plate includes a first area and a second area adjacently connected to the first area;
   a display panel attached to the first area; and
   a spacer attached to a part or all of the second area, wherein a height of the spacer is greater than a height of the display panel;
   wherein the spacer includes a housing and an injection cavity recessed into interior of the housing, the injection cavity is close to the display panel and the injection cavity is filled with an injection material; and
   a space cavity is provided at a side of the display panel close to the spacer, and the space cavity is filled with the injection material.

In an optional embodiment, the spacer is closely attached to the display panel.

In an optional embodiment, an orthogonal projection of the spacer on the cover plate covers the second area in a case that the spacer is attached to all of the second area.

In an optional embodiment, an outer side of the spacer is aligned with an edge outer side of the cover plate.

In an optional embodiment, the housing is made of a transparent material.

In an optional embodiment, the injection material includes at least one of epoxy resin, polyurethane and silicone.

In an optional embodiment, the housing is provided with at least one injection hole for filling the injection cavity with the injection material.

In an optional embodiment, a thickness of the housing is 0.2 mm to 0.8 mm.

In an optional embodiment, the cover plate is rectangular, and the spacer is attached to the second area at a first side and/or the second area at a second side; wherein the first side and the second side are different sides.

In an optional embodiment, the cover plate is a circular glass cover plate, the spacer is in a form of a circular ring, and an outer diameter of the circular ring is the same as a radius of the glass cover plate.

In an optional embodiment, a sealant is filled between the spacer and the display panel.

In an optional embodiment, the display panel includes at least one of an OLED display panel, an LCD display panel and an LED display panel.

The present disclosure further provides an assembly method of a display module, including:
   providing a cover plate, wherein a side of the cover plate includes a first area and a second area adjacent to the first area;
   attaching a display panel to the first area; and
   attaching a spacer to a part or all of the second area; wherein a height of the spacer is greater than a height of the display panel, the spacer includes a housing and an injection cavity recessed into interior of the housing, the injection cavity is close to the display panel, and the injection cavity is filled with an injection material; and
   a space cavity is provided at a side of the display panel close to the spacer, and the space cavity is filled with the injection material.

In an optional embodiment, the attaching the spacer to the part or all of the second area includes:
   placing the cover plate attached with the display module into a fixture; and
   placing the spacer into the fixture, so that the spacer is attached to all of the second area.

In an optional embodiment, the attaching the spacer to the part or all of the second area includes:
   attaching the housing to the part or all of the second area; wherein the injection cavity is close to the display panel; and
   filling the injection cavity with the injection material through an injection hole provided in the housing.

The present disclosure further provides a display apparatus, including a middle frame and the above display module; wherein
   the display module is installed on the middle frame, and the middle frame is configured for supporting the cover plate, the spacer and the display panel.

In an optional embodiment, the middle frame includes:
   a first frame body located at a side of the spacer away from the cover plate, wherein an orthographic projection of the first frame body on the cover plate overlaps with an orthographic projection of the display panel on the cover plate.

In an optional embodiment, the middle frame includes:
   a second frame body closely attached to an outer side of the spacer and a first edge outer side of the cover plate; and
   a third frame body closely attached to a second edge outer side of the cover plate and having a gap with the display panel; wherein the second edge outer side is an edge outer side except the first edge outer side.

For the display module provided in the present disclosure, in one hand, the display panel is attached to the first area of the cover plate, a part or all of the second area surrounding the first area is attached with the spacer, and the height of the spacer is greater than the height of the display panel, therefore, the height of the display module at the corresponding position can be raised through the spacer. In this way, when the display module needs to be installed with the middle frame, the spacer is located between the middle frame and the display panel, and since the height of the spacer is greater than that of the display panel, at the position of the spacer, the middle frame does not need to overlap with this position of the second area of the cover plate, which avoids interference between the middle frame and the display panel at this position. Therefore, when the spacer is attached to a part of the second area, the width of some side edges in the border of the display apparatus can be reduced. When the spacer is attached to all the second area, the width of the entire border of the display apparatus can be reduced. In either case, the design of a narrow border display device can be achieved.

In another hand, since the spacer includes the housing and the injection cavity recessed into interior of the housing, the injection cavity is close to the display panel and the injection cavity is filled with the injection material; the space cavity is provided at a side of the display panel close to the spacer, and the space cavity is filled with the injection material. In this way, during assembly, the housing of the spacer can be attached to the back of the cover plate, and then the injection material is filled into the injection cavity, so that the housing does not need to directly contact to the display panel, thereby protecting the display panel. After filling with the injection material, the gap between the housing and the display panel can be filled, thereby improving the support for the display module.

The above description is only an overview of the technical solution of the present disclosure. In order to have a clearer understanding of the technical means of the present disclosure, it can be implemented according to the content of the specification. In order to make the above and other purposes, features, and advantages of the present disclosure more obvious and easier to understand, the specific implementation methods of the present disclosure are listed below.

BRIEF DESCRIPTION OF THE DRAWINGS

In order to provide a clearer explanation of the technical solutions in the embodiments of the present disclosure or related art, a brief introduction will be given below to the accompanying drawings required in the descriptions of the embodiments or related art. It is obvious that the accompanying drawings in the following description are some embodiments of the present disclosure. For those skilled in the art, other accompanying drawings can be obtained based on these drawings without creative labor. It should be noted that the proportions in the accompanying drawings are only for illustrative purposes and do not represent the actual proportions.

FIG. 7-1 schematically shows a diagram of a spacer being attached to a part of a second area according to the present disclosure;

FIG. 7-2 schematically shows another diagram of a spacer being attached to a part of a second area according to the present disclosure;

DETAILED DESCRIPTION

In order to clarify the purpose, technical solution, and advantages of the embodiments of the present disclosure, the following will provide a clear and complete description of the technical solution in the embodiments of the present disclosure in conjunction with the accompanying drawings. Obviously, the described embodiments are a part of the embodiments of the present disclosure, not all of them. Based on the embodiments of the present disclosure, all other embodiments obtained by persons skilled in the art without creative labor fall within the scope of protection of the present disclosure.

Figure 1:
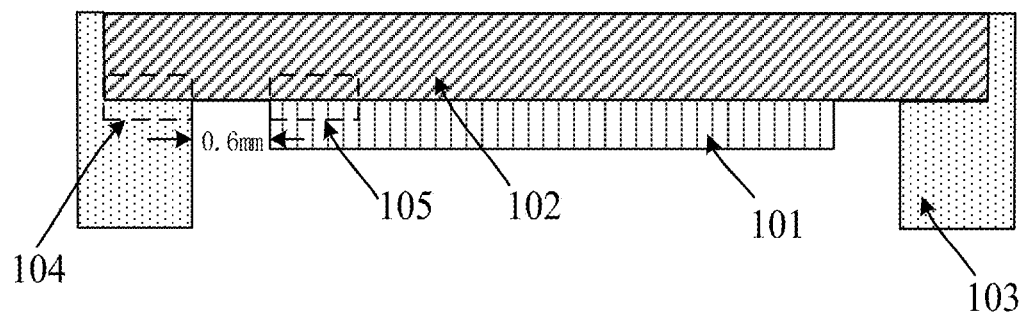
FIG. 1 schematically shows a cross-sectional structural diagram of a display module in related art.

In related art, as shown in FIG. 1, a schematic diagram of connection among a middle frame, a display panel and a cover plate of a display apparatus in the related art is shown. As shown in FIG. 1, the display panel 101 is attached to the cover plate 102, and then the display panel 101 is installed on the middle frame 103 through the cover plate 102. The display panel 101 is located between the middle frame 103 and the cover plate 102, so that the middle frame 103 can well support the display panel 101 through the cover plate 102.

As shown in FIG. 1, the cover plate 102 has two stacked areas, namely, a stacked area 104 in which the middle frame 103 overlaps with the cover plate 102 and a stacked area 105 in which the cover plate 102 is bonded to the display panel 101. In practice, due to a bonding tolerance of the display panel 101 and an assembly tolerance in connecting the cover plate 102 to the middle frame 103, it is necessary to avoid interference between the middle frame 103 and the display panel 101, and thus a distance between the middle frame 103 and the display panel 101 is generally 0.6 mm, that is, it is necessary to keep a distance of 0.6 mm between the stacked area 104 and the stacked area 105.

In this way, a space for the stacked area 104 needs to be at least reserved at the cover plate 102 so as to install the middle frame 103, and a spacing distance of 0.6 mm is reserved so as to avoid interference between the middle frame 103 and the display panel 101. In this way, a width of a non-display area (an area where the display panel is not located) is increased, that is, a width of the display apparatus is increased, which does not facilitate development of a display apparatus with a narrow border.

In order to realize the display apparatus with a narrow border, one solution is to reduce a boundary of the display panel, that is, to reduce a boundary of the stacked area 105 by downsizing the display panel. However, it is technically difficult to reduce the boundary of the display panel, and after reduction, a size of the display area may be affected and display effect may inevitably be affected.

In view of this, another design solution of the display apparatus with the narrow border is proposed in the present disclosure. Specifically, assembly of a display module is improved, that is, a display module is provided so that interference between the middle frame and the display panel can be ignored in connecting a middle frame with the display module, that is to say, there is no need to reserve a mounting distance of 0.6 mm for the middle frame at some or all of edges of a cover plate.

Figure 2:
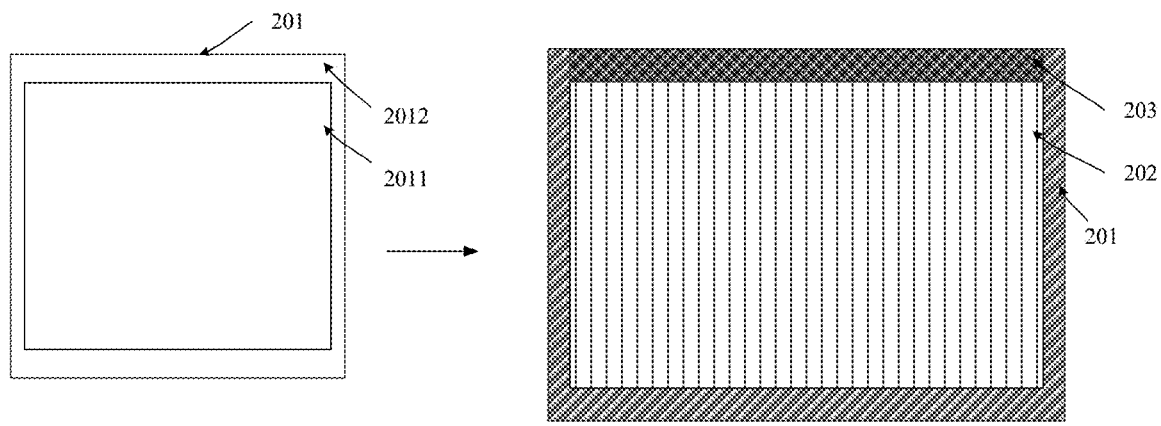
FIG. 2 schematically shows a plan view of a display module according to the present disclosure in a top perspective.
Figure 3:
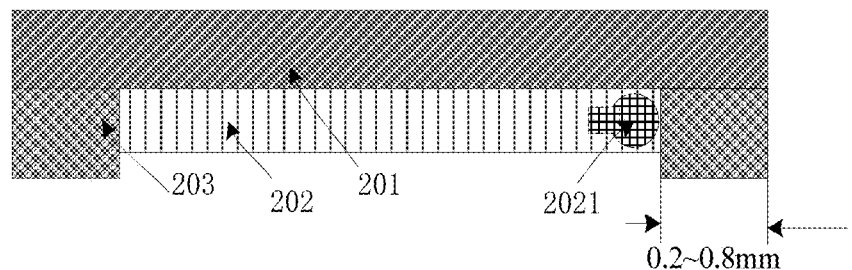
FIG. 3 schematically shows a sectional diagram of a display module according to the present disclosure.
Figure 4:
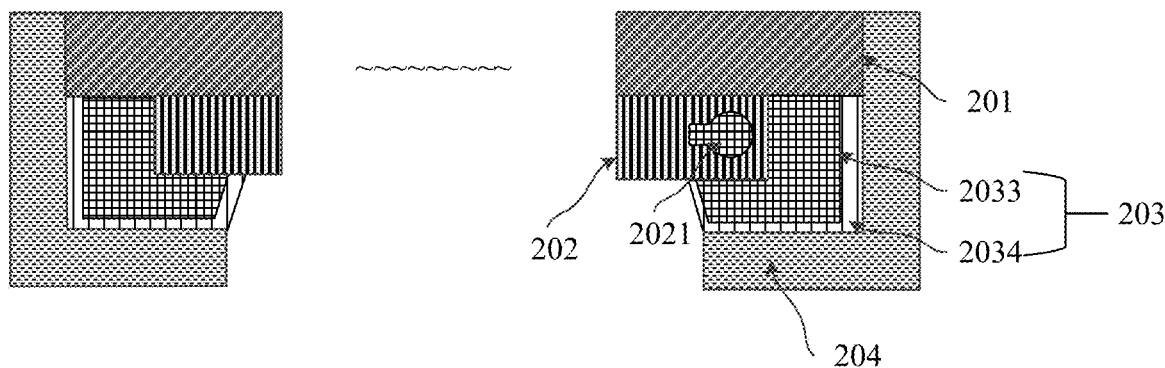
FIG. 4 schematically shows a structural diagram of a display module with a space cavity in a display panel according to the present disclosure.

In order to realize above technical concept, a spacer is mainly added in the display module in the present disclosure. As shown in FIGS. 2 to 4, a spacer 203 is located at an outer side of the display panel 202, and the display module is raised by the spacer 203. Thus, when the display module is connected to the middle frame 204, the middle frame 204 is connected to an outer edge of the cover plate 201, and the middle frame 204 is further connected to an outer edge of the spacer 203 at a position where the cover plate 201 is attached with the spacer 203. Because the spacer 203 has raised the display module, the middle frame 204 overlaps with the spacer 203 at the position of the spacer, thus forming a stacked structure of the cover plate, the spacer and the middle frame.

In installing the middle frame 204 and the display module, the middle frame 204 overlaps with the spacer 203 and the spacer 203 overlaps with the cover plate 201, so that a stacked area between the middle frame 204 and the spacer 203 is not in a same plane as the stacked area 105 between the display panel 201 and a glass cover plate 201, and the stacked area between the middle frame 204 and the spacer 203 is not located in a space area where the display panel 202 is located, and thus interference between the middle frame 204 and the display panel 202 can be avoided, and there is no need to consider installation tolerance and a spacing distance of 0.6 mm during installation. Therefore, there is no need to reserve an installation distance of 0.6 mm for the middle frame 204 at the cover plate 201, so that a size of an edge area of the cover plate 201 is reduced, that is, a size of a non-display area (border) is reduced, thereby realizing a design of the display apparatus with the narrow border.

It should be noted that the display panel referred to in the present disclosure may include at least one of an OLED (Organic Light-Emitting Diode) display panel, an LCD display panel and an LED display panel. That is to say, the OLED display panel, the LCD display panel and the LED display panel are all assembly structures to which the display module according to the present disclosure can be applicable.

Firstly, as shown in FIGS. 2, 3 and 4, a schematic structural diagram of a display module of the present disclosure is shown. FIG. 2 is a plan view of the display module of the present disclosure from a top perspective, and FIG. 3 is a schematic cross-sectional diagram of the display module. As shown in FIGS. 2 and 3, the display module includes:

a cover plate 201, a side of the cover plate 201 including a first area and a second area 2012 adjacently connected to the first area 2011;

a display panel 202 attached to the first area 2011; and a spacer 203 attached to a part or all of the second area 2012, a height of the spacer 203 being greater than a height of the display panel.

The spacer 203 includes a housing 2034 and an injection cavity 2033 recessed into interior of the housing, and the injection cavity 2033 is close to the display panel 202, and the injection cavity 2033 is filled with an injection material. A space cavity 2021 is provided at a side of the display panel 202 close to the spacer 203, and the space cavity 2021 is filled with the injection material.

In this embodiment, the cover plate 201 can be a glass cover plate, and certainly, in other embodiments, it can also be a cover plate made of other materials. As shown in a left panel of FIG. 2, the second area 2012 is adjacently connected to the first area 2011, that is, the first area and the second area are adjacent areas. The first area 2011 is configured for attaching the display panel 202, and the second area 2012 is generally configured for installing the middle frame. In an alternative example, in practice, the second area may be an edge area of the cover plate 201, that is, the second area 2012 may be an outer edge area surrounding the first area 2011.

As shown in a right panel of FIG. 2, which is a top plan view with the spacer 203 attached, the spacer 203 can be attached to all of the second area 2012 or to a part of the second area 2012, which can be determined according to a shape and a specific application function of the display module. If it is applied to a mobile phone, in this case, a space for a mobile handset and a camera needs to be reserved on the border, and thus the spacer can be attached to a part of the second area and staggered with the space for the mobile handset and the camera. If it is applied to wearable devices, such as telephone watches, the spacer can be attached to all of the second area.

For example, as shown in FIG. 2, the second area 2012 is an edge area surrounding the first area 2011, and the second area 2012 is shaped like a rectangular frame, and the spacer 203 can be attached to one side or a plurality of sides of the second area 2012, and as shown in FIG. 2, the spacer 203 is attached to an upper side of the rectangular frame 2012. Certainly, in other examples, the spacer can be attached to the whole rectangular frame.

In specific implementation, when the spacer needs to be attached to all of the second area 2012, the spacer 203 can be a component with a same shape as the second area, that is to say, a shape of a cross section of the spacer 203 is the same as that of the second area, and the spacer can be an integrally formed component so that the spacer 203 can cover all of the second area 2012. Certainly, in a case that the spacer need to be attached to all of the second area 2012, there may be a plurality of spacers provided, and different spacers can be spliced in turn so as to cover all of the second area. In this case, there may be a certain spacing distance between adjacent spacers.

In an alternative example, an orthographic projection of the spacer 203 on the cover plate does not overlap with an orthographic projection of the display panel on the cover plate, or the orthographic projection of the spacer 203 on the cover plate overlaps with the orthographic projection of the display panel on the cover plate. In a case that the orthographic projection of the spacer 203 on the cover plate overlaps with the orthographic projection of the display panel on the cover plate, a bottom side of the spacer 203 may be overlapped with the display panel 202 so as to improve a supporting function for the module.

When the spacer is attached to a part of the second area 2012, there may be at least one spacer 203 provided, and different spacers are located at different positions on the second area 2012 requiring a narrow border design.

In some cases, there may be a hollow space cavity 2021 in the display panel. In the present disclosure, injection can be carried out in the space cavity 2021, that is, the injection material is filled in the space cavity 2021. The injection material can be at least one of epoxy resin, polyurethane and silicone, so as to improve support for the display module.

Certainly, in some cases, if the space cavity of the display panel is not at a position where the spacer is installed, it can be filled with the injection material, or it is not necessary to fill the injection material in the space cavity.

In an alternative example, a structure of the spacer 203 is illustrated. In some examples, the spacer can be an integrally formed member, such as a solid member made of materials such as PC, PP, ABS and PET with a large modulus. When it is assembled on the cover plate, attachment can be made with a fixture.

In another alternative example, as shown in FIGS. 4, and 10 to 12, in order to make the spacer 203 be closely attached to the display panel while ensuring that the spacer 203 may not collide with the display panel and cause damage to the display panel during installation, the spacer 203 may include a housing and an injection cavity recessed into the interior of the housing, as shown in FIG. 4, that is, the spacer 203 includes a housing 2034 and an injection cavity 2033 recessed into the interior of the housing, and the injection cavity is close to the display panel. The injection cavity is filled with an injection material.

In this alternative example, the injection cavity is provided close to the display panel, and because the injection cavity is recessed into the interior of the housing, a cavity covering an edge of the display panel may be formed. In this way, after the housing is attached to the cover plate, the injection material can be injected into the injection cavity, thus filling a cavity between the display panel and the housing. Because the injection material is flexible (has certain fluidity) during the injection process, no damage may be caused to the display panel.

When this spacer 203 is adopted, the housing 2034 can be firstly attached to the cover plate, and the housing 2034 can be made of materials with a large modulus and high hardness such as PC, PP, ABS, etc. Because a side of the housing is recessed, an injection cavity can be formed for injection molding, and thus in installing the spacer 203, the housing 2034 can be firstly aligned with an outer side of the cover plate, and because the injection cavity is recessed into the housing 2034, there is a certain gap between the injection cavity and the display panel, and the display panel may not be touched, then the injection cavity can be filled with the injection material, and with this filling, the injection cavity is filled up with the injection material, and thus bonding between the spacer 203 and the display panel and bonding between the spacer 203 and the cover plate 201 can be realized, and thus the spacer 203 can be closely attached to the display panel. Then, the injection material is cured, so that the spacer can function to support the module. The injection material can be cured in the injection cavity 2033 by ultraviolet curing, thermal curing, etc.

After the injection material is filled, support of the spacer 203 to the cover plate can be improved, thereby improving stability of the whole display module.

In an alternative example, the housing 2034 can be made of a transparent material. In this case, ultraviolet light can be facilitated to be transmitted through the housing 2034 into the injection cavity when the injection material in the injection cavity is cured and molded. Correspondingly, at least one of epoxy resin, polyurethane and silicone can be used as the injection material.

The housing 2034 can be made of PC, PP, ABS, PET or other transparent materials with a large modulus.

In an alternative example, in order to facilitate filling of the injection cavity with the injection material, at least one injection hole 2035 communicating with the injection cavity can be provided on the housing 2034, and a size of the hole can be set according to actual needs.

Certainly, in practice, no injection hole may be provided. In this case, an injection hole may be provided in the housing 2034 by tools such as a syringe during injection. Certainly, if no injection hole is provided, the injection material may not be filled in the injection cavity, and in this case, although support of the spacer 203 to the cover plate may be reduced, connection between the display module and the middle frame may not be affected, and support for the display module can also be realized through the middle frame.

In another alternative example, a thickness of the housing 2034 can be 0.2 mm to 0.8 mm, while an overall thickness of the spacer 203 can be kept between 0.5 mm and 1.1 mm. Certainly, it can be understood that the thickness of the housing 2034 can be non-uniform, that is, the thickness of the housing 2034 can be different at different positions, so that the overall thickness of the spacer 203 can be flexibly controlled to be kept between 0.5 mm and 1.1 mm, and a corresponding border can be reduced by at least 0.5 mm and 1.1 mm.

Figure 10:
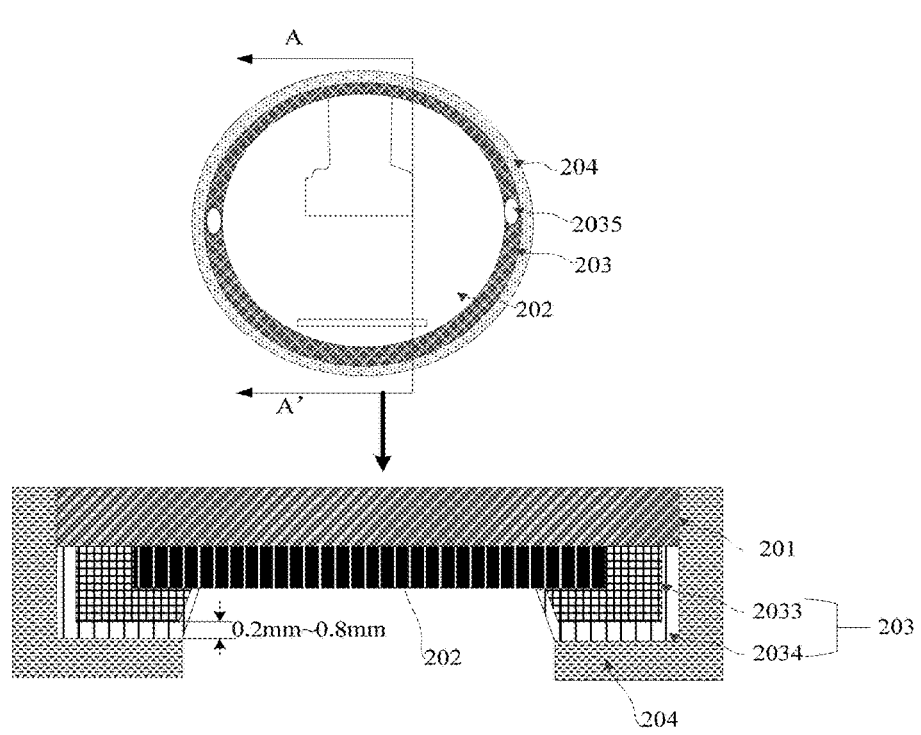
FIG. 10 schematically shows a structural diagram of a display apparatus A according to the present disclosure.
Figure 11:
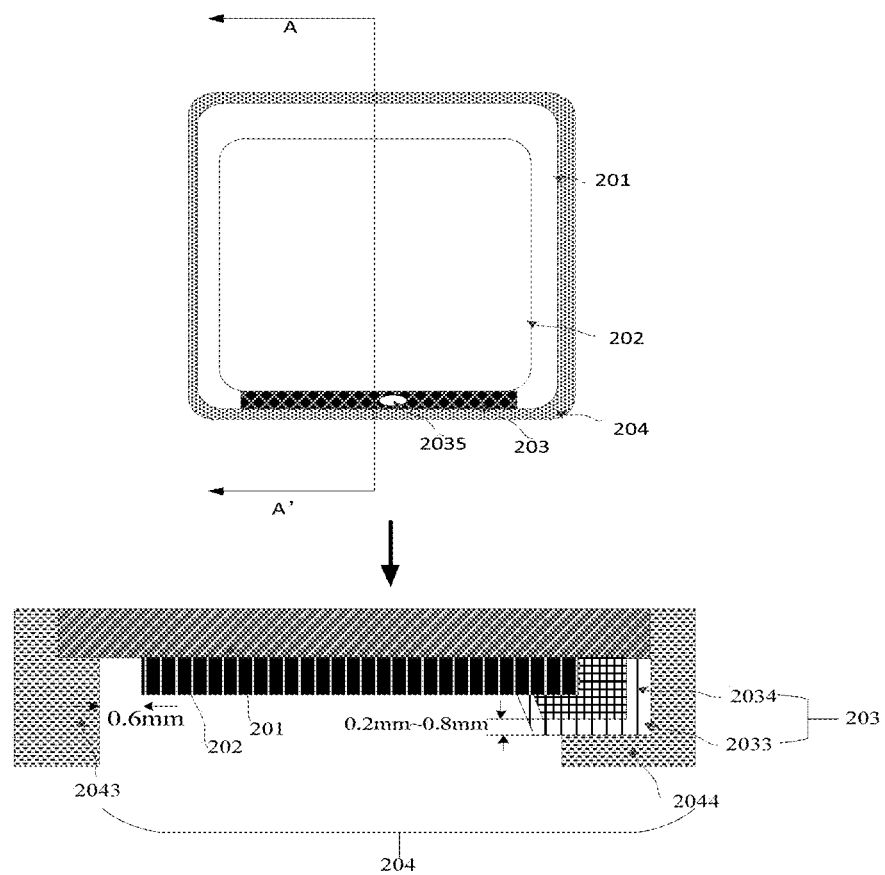
FIG. 11 schematically shows a structural diagram of a display apparatus B according to the present disclosure.

As shown in FIGS. 4, and 10 11, the thickness of a side of the housing 2034 away from the cover plate may be greater than that of a side of the housing 2034 close to the cover plate. In this case, the spacer 203 and the middle frame 204 together enhance the support for the whole display module.

The height of the spacer 203 can be greater than that of the display panel, that is, the spacer 203 exceeds the display module in height on the cover plate. As shown in FIGS. 3 and 4, the height of the spacer 203 exceeds the height of the display panel. In an alternative example, the height of the spacer 203 exceeds the height of the display panel 202 by 0.2 mm to 0.3 mm, that is, height difference between the spacer 203 and the display panel 202 is between 0.2 mm and 0.3 mm. Certainly, in an example, the height difference may not be limited to the above, and in a case that the display module is a watch type display module, the height of the spacer may be 1 mm to 2 mm.

In this way, when the display module is connected to the middle frame, one side of the middle frame can be connected to the outer side of the spacer 203 (left and right outer sides of the spacer in FIG. 3) and the other side of the middle frame can overlap with the spacer 203 (a lower side of the spacer in FIG. 3) at the position of the spacer 203, so that the display module can be raised by the spacer 203, and thus the middle frame can be prevented from being directly overlapped with the cover plate at the position of the spacer 203, and then a stacked area of the display panel and the cover plate can be avoided, so that the middle frame is prevented from interfering the display panel.

It should be noted that FIGS. 3 and 4 of the present application are schematic illustrations by taking the spacer attached to all of the second area as an example.

Figure 5:
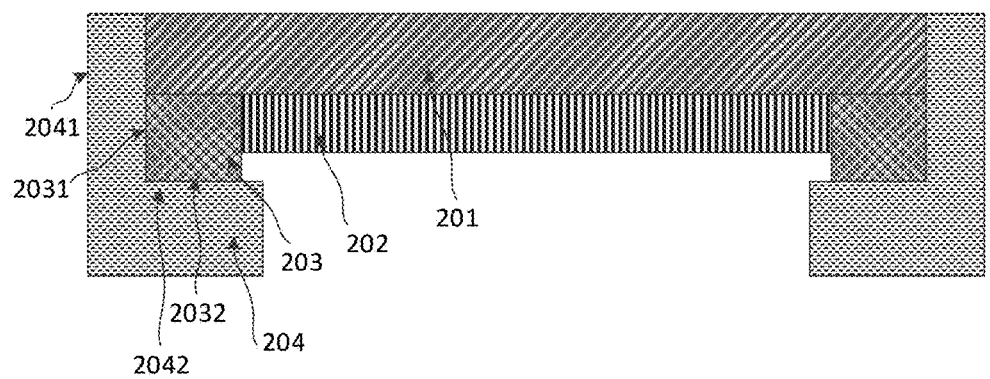
FIG. 5 schematically shows a structural diagram of a display apparatus with a middle frame and a display module installed.

As shown in FIG. 5, a schematic diagram of the display apparatus with the middle frame and the display module installed is shown. As shown in FIG. 5, when the middle frame 204 is connected to the display module, at the position of the spacer 203, one side 2041 of the middle frame 204 is attached to the outer side of the cover plate 201 and to the outer side 2031 of the spacer 203, and the other side 2042 of the middle frame 204 is overlapped with another outer side 2032 of the spacer 203. It can be seen that because the spacer 203 is higher than the display panel 202, the middle frame 204 can prevented from forming a stacked area with the cover plate 201 at the position of the spacer 203, so that the middle frame 204 may not interfere with the display panel 202 due to presence of the spacer 203, and there is no need to reserve an area of 0.6 mm at the cover plate 201, so that a width of the cover plate where the spacer 203 is located can be reduced, thereby realizing a narrow border.

When the display module is adopted, a magnitude by which the border can be reduced is related to a width of the spacer 203, and the width of the spacer 203 refers to a width of an orthogonal projection of the spacer 203 on the cover plate. As shown in FIG. 3, in an alternative example, the width of the spacer 203 can be set to 0.5 mm to 1.1 mm, and a corresponding border can be reduced by at least 0.5 mm to 1.1 mm. Further, a smaller border of the display apparatus can be realized by controlling the width of the spacer 203.

In an alternative embodiment, the spacer 203 may have a certain gap with the display panel when attached to the second area, but the gap may be much less than 0.6 mm.

In another alternative example, after the spacer 203 is attached to the cover plate, it can be closely attached to the display panel which is shown in FIGS. 3, 4 and 5. Main implementation of this closely attaching can be that after the display panel is attached to the cover plate, the cover plate is placed into the fixture and the spacer 203 is attached to the second area, so that a width of the cover plate in the non-display area can be fully reduced.

A sealant can be filled between the spacer 203 and the display panel to improve sealing performance between the spacer 203 and the display panel, and the sealant can be a UV glue or a moisture curing glue.

In an alternative example, the outer side of the spacer 203 can be aligned with an edge outer side of the cover plate, and as shown in FIG. 5, the outer side 2031 of the spacer 203 can be aligned with the edge outer side of the cover plate 201. In this way, the middle frame 204 can be facilitated to be attached to the cover plate and the spacer 203, so that there is no staggered gap between the middle frame and the edge outer side of the cover plate as well as and the outer side 2031 of the spacer 203, thereby facilitating assembly of the middle frame and improving yield of the display apparatus.

In the following, a bonding position of the spacer 203 in the second area will be described. Specifically, for the display apparatus with different functional requirements, an overall shape of the display module is different and positions of configured functional components (such as the camera and the handset) are also different. For several display modules, following bonding modes of the spacer 203 to the cover plate 201 are proposed in the present disclosure.

<First Bonding Mode>

The spacer 203 is attached to all of the second area, which is suitable for a display module where there is no need to reserve a space for functional parts (such as the camera and the handset) in the non-display area of the cover plate. Accordingly, the orthographic projection of the spacer 203 on the cover plate covers the second area, which can be understood as that the orthographic projection of the spacer 203 on the cover plate is the second area.

In this way, in an alternative example, if the cover plate is a circular glass cover plate, the spacer 203 is in a form of a circular ring and an outer diameter of the circular ring is consistent with a radius of the glass cover plate. If the cover plate is rectangular, the second area is the rectangular frame as shown in FIG. 2, and the spacer 203 is also a rectangular frame with its orthogonal projection on the cover plate completely coinciding with the second area. When attaching the spacer 203, the cover plate 201 and the spacer 203 can be aligned firstly by using the fixture, and then the spacer 203 can be attached to the cover plate with no gap.

Figure 6:
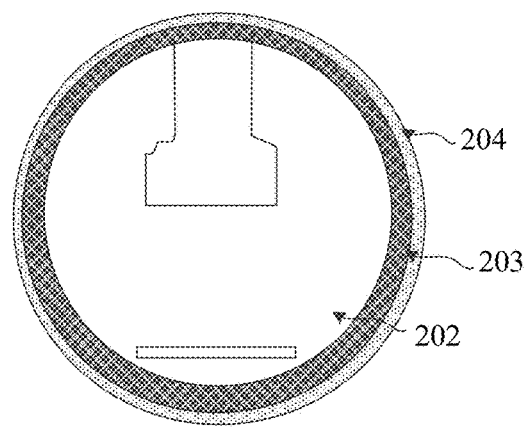
FIG. 6 schematically shows a structural diagram of another display apparatus with a middle frame and a display module installed.

As shown in FIG. 6, a schematic structural diagram among the spacer 203, the display panel and the cover plate 201 is shown in a case that the display module is circular. FIG. 6 is a plan view of the display module from a top perspective, in which the cover plate 201 is a circular glass cover plate and the spacer 203 is in a form of a circular ring with a same size as the glass cover plate, that is, the radius of the circular outer ring is the same as the radius of the glass cover plate, so that after aligning the spacer 203 and the cover plate, the outer side 2031 of the spacer 203 can be aligned with the outer edge of the cover plate (the outer edge of the cover plate cannot be seen in the top view in FIG. 6), and the width of the border of the whole display apparatus is reduced, so that the narrow border of the display module of a watch, such as a narrow border of a telephone watch, can be realized.

<Second Bonding Mode>

The spacer is attached to a part of the second area, which is suitable for a display module where it needs to reserve a space for functional parts in the non-display area of the cover plate. Accordingly, the orthogonal projection of the spacer 203 on the cover plate covers the part of the second area.

In this way, in an alternative example, if the cover plate is rectangular, the spacer 203 can be attached to a first side of the second area 2012 and/or a second side of the second area 2012. The first side and the second side are different sides of the second area. If the cover plate is circular, the spacer 203 can be an arc ring, which is configured to be attached to a position on the second area 2012 requiring a narrow border design.

When the cover plate is rectangular, the spacer can be attached only to the first side, or only to the second side, or to both of the first side and the second side. The first side and the second side can be adjacent sides, and if the first side is a left side, the second side can be an upper side or a lower side. Alternatively, the first side and the second side can be two opposite sides, and if the first side is the left side, the second side is a right side, or if the first side is the upper side, the second side is the lower side. Certainly, in practice, the spacer can be further attached to a third side, in this case, the spacer can be attached to all of three sides of the second area which is a rectangular area, so as to reduce the border of the display module as much as possible. Taking a mobile phone as an example, widths of left and right borders and a lower border of the mobile phone can be reduced as much as possible.

Figures 1, 7:
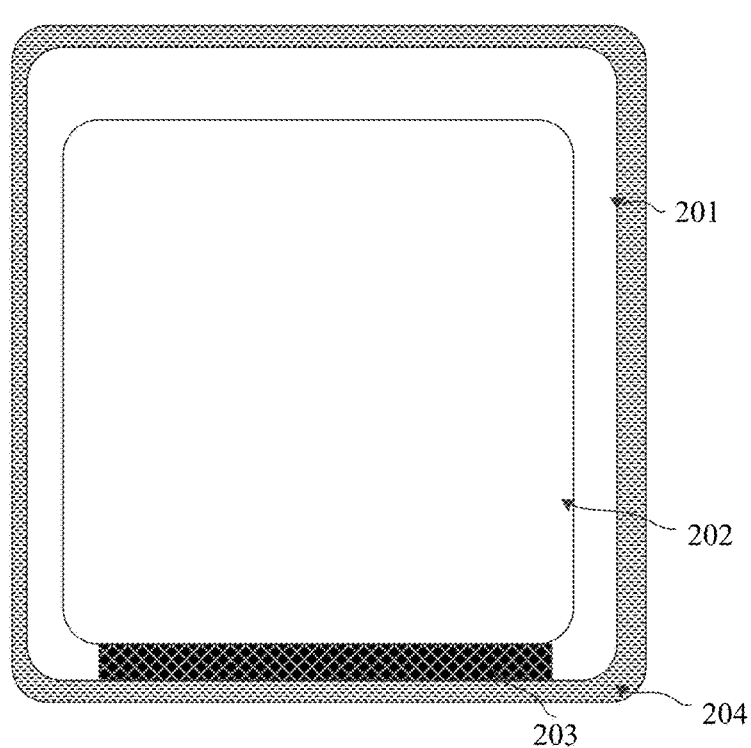
Figures 2, 7:
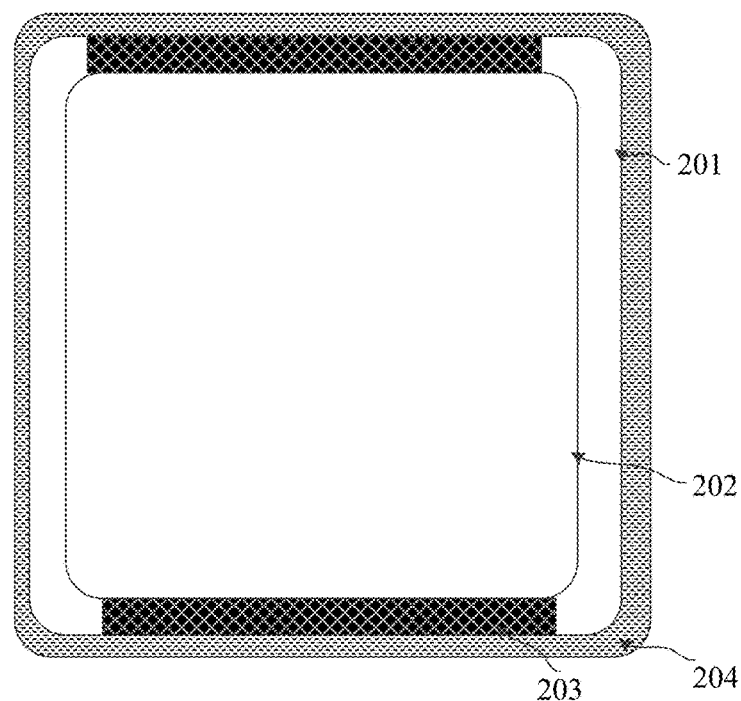

As shown in FIG. 7-1 and FIG. 7-2, two types of bonding areas of spacers are shown. As shown in FIG. 7-1, the spacer 203 is bonded on a lower side area of the second area to reduce the width of the lower border, and as shown in FIG. 7-2, the spacer 203 is bonded on the lower side area and an upper side area of the second area to reduce widths of the lower border and an upper border. As can be clearly seen from FIG. 7-1 and FIG. 7-2, the width of the upper border of the display apparatus is obviously reduced after the spacer 203 is attached to the upper side area.

The display apparatus as shown in FIG. 7-1 can be a mobile phone display apparatus, and the display apparatus as shown in FIG. 7-2 can be a square wearable apparatus.

Certainly, FIG. 7-1 and FIG. 7-2 are only illustrative. In other alternative examples, the spacer 203 can also be attached to two adjacent sides of the second area. As shown in FIG. 7-1, the spacers can be attached to the lower side area and a left side area of the second area, or the spacer can be attached to the lower side area and a right side area of the second area.

Correspondingly, a display apparatus is further provided in the present disclosure, which may include the display module described above and a middle frame. The display module is installed on the middle frame, and the middle frame is configured for supporting the cover plate, the spacer 203 and the display panel.

Figure 8:
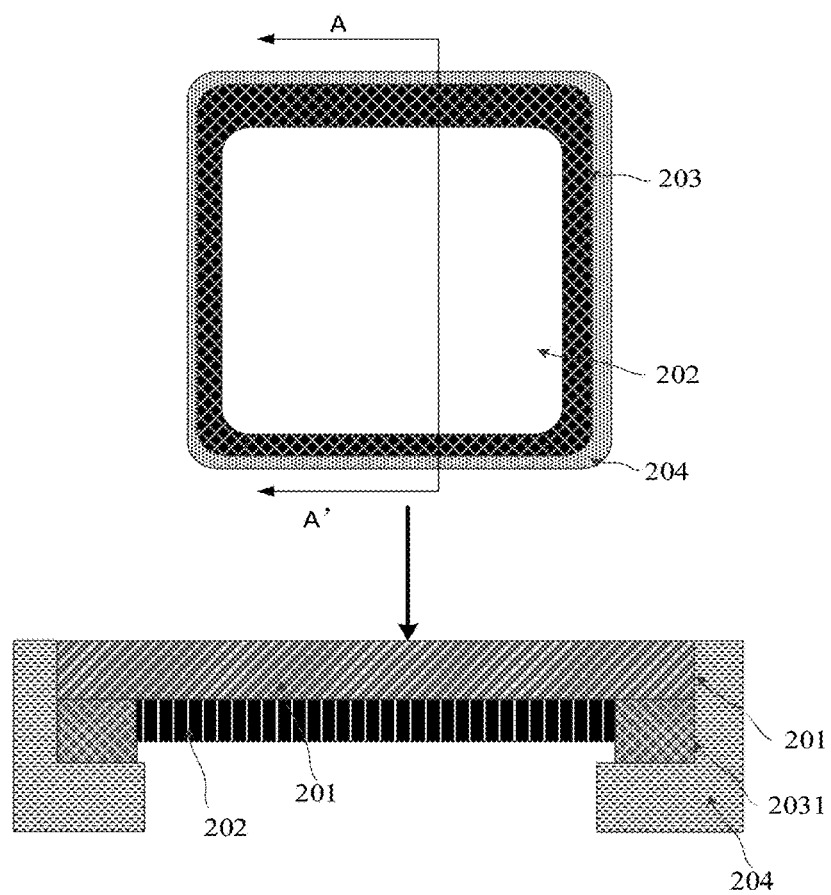
FIG. 8 schematically shows a structural diagram of a display apparatus with a spacer attached to all of a second area according to the present disclosure.
Figure 9:
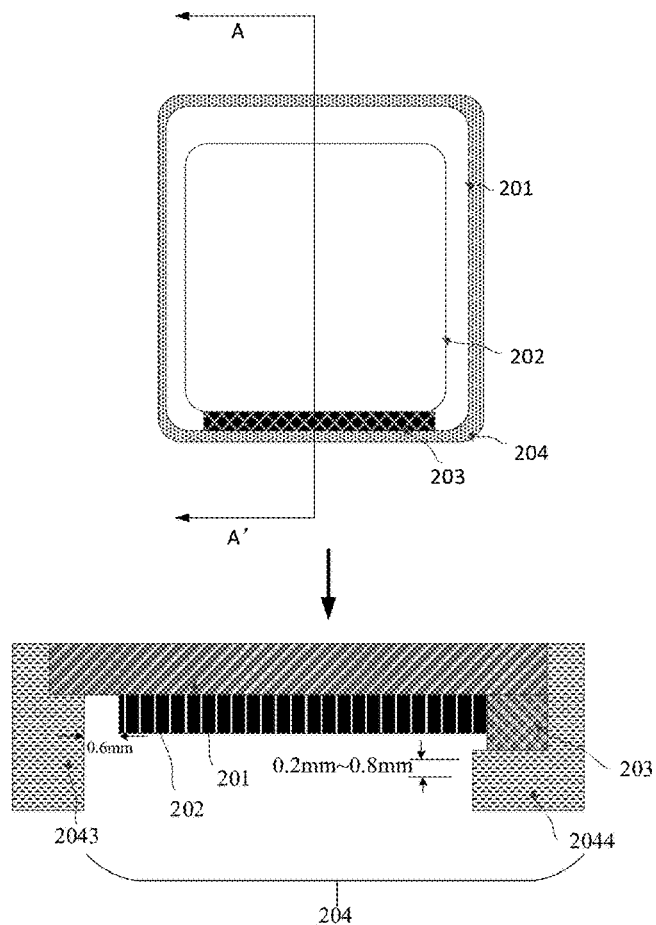
FIG. 9 is a schematic sectional diagram of the display module shown in FIG. 7-1, assembled with a middle frame, in a direction of AA'.

As shown in FIGS. 8 and 9, a schematic structural diagram of the display apparatus according to the present disclosure is shown. FIG. 8 is a schematic diagram of the display module with the spacer attached to all of the second area 2012, and FIG. 9 is a sectional view of the display module shown in FIG. 7-1 in an AA' direction after assembling with the middle frame.

As shown in FIG. 8 and FIG. 9, taking the display module as a rectangle as an example, the second area 2012 is a rectangular frame. As shown in FIG. 8, the middle frame may include first frame bodies (left and right frame bodies of the middle frame in the figure), which are attached to the outer side of the cover plate and the outer side 2031 of the spacer 203 and are overlapped with an outer side 2033 of the spacer 203. Due to presence of the spacer 203, the middle frame 204 may not interfere with the display panel, and thus the orthographic projections of the first frame bodies on the cover plate are overlapped with the orthographic projection of the display panel on the cover plate, thus improving support of the middle frame for the display module.

As shown in FIG. 8 and FIG. 9, that is to say, the middle frame can be spaced to cover a part of the display panel without contacting with the display panel. In this case, a size of a bottom border of the middle frame can be slightly larger, so as to enhance encasing for an edge of the display module.

As shown in FIG. 8, it is shown that the spacer 203 is attached to all of the second area 2012. In this case, a periphery of the display module can be raised by the spacer 203, so that the middle frame 204 can be closely attached to the outer edge of the cover plate and the outer side of the spacer 203. In this case, the bottom border of the middle frame (a border at a lower side) can be directly overlapped with the spacer 203, and a thickness of the bottom border of the whole middle frame 204 can be uniform.

Referring to FIG. 9, it is shown that the spacer 203 is attached to the part of the second area. In this case, the middle frame 204 includes a second frame body 2043 and a third frame body 2044, and the second frame body 2043 is closely attached to the outer side 2031 of the spacer 203 and a first edge outer side 2013 of the cover plate. The third frame body 2044 is closely attached to a second edge outer side 2014 of the cover plate 201, and there is a gap between the third frame body 2044 and the display panel 202.

The second edge outer side is an edge outer side except the first edge outer side.

As shown in FIG. 9, the middle frame includes a second frame body 2043 at the spacer 203, and the second frame body 2043 includes a bottom border (a border in a horizontal direction in FIG. 9) and a side border (a border in a vertical direction in FIG. 9), the bottom border is overlapped with the spacer 203, and the side border is attached to the outer side 2031 of the spacer 203 and the outer edge of the cover plate. The middle frame includes a third frame body 2044 at other positions except the spacer 203. Similarly, the third frame body 2044 includes a bottom border and a side border, and the bottom border is overlapped with the cover plate, and the side border is attached to the outer edge of the cover plate.

Since the height of the spacer 203 is greater than the height of the display panel, a thickness of the bottom border of the third frame body 2044 overlapped with the cover plate is greater than a thickness of the bottom border of the second frame body 2043 overlapped with the spacer 203, so that the middle frame has a bottom border with a thickness adapted to the display module.

Since the bottom border of the third frame body 2044 needs to be overlapped with the cover plate 201 at positions except the spacer 203, a gap is required to be kept with the display panel 202, and a width of the gap can be 0.6 mm, that is to say, an interference distance of 0.6 mm needs to be reserved for the middle frame in an area of the cover plate except the spacer 203.

In the following, structures of several alternative display apparatuses proposed according to the inventive concept of the present disclosure will be illustrated.

Display Apparatus A;

As shown in FIG. 10, taking a telephone watch with a circular display apparatus A as an example, a panel at an upper side of FIG. 9 is a schematic plan view of the telephone watch from a top perspective, and a panel at a lower side of the FIG. 9 is a schematic sectional view of the telephone watch along a line AA', and the telephone watch includes a circular glass cover plate 201, a display panel 202 and a circular ring-shaped spacer 203. The circular ring-shaped spacer 203 is a circular ring of which an inner side wall is recessed into a circular ring wall, and an outer diameter of the circular ring is the same as a radius of the cover plate 201. Thus, with the spacer 203 aligned with the glass cover plate, the outer side of the spacer is aligned with the outer side of the cover plate, i.e., the outer side of the spacer and the outer side of the cover plate are on a same vertical line.

A thickness of a housing 2034 of the spacer 203 can be 0.2 mm, and the inner side of the spacer 203 is closely attached to a side edge of the display panel, and a thin layer of sealant can be filled between them, so as to isolate water vapor. As shown in FIG. 10, the spacer 203 can also have a certain stacked area with the display panel, that is, the orthogonal projection of the spacer on the cover plate can have an overlapping area with the orthogonal projection of the display panel on the cover plate, so that the spacer can function to support the display panel.

The spacer 203 can be provided with two injection holes 2035, which can be symmetrical on the circular ring. The housing 2034 of the spacer is transparent, that is to say, the spacer is in a form of a transparent ring, and a material filled in the internal injection cavity 2033 can be an ultraviolet curing material, that is, a material that can be quickly cured by ultraviolet light, thus realizing mass production. Certainly, other materials such as epoxy resin, polyurethane and silicone can also be used.

The side border of the middle frame 204 is connected to the outer side of the spacer 203 at the outer side of the cover plate at the same time, and the bottom border of the middle frame 204 is overlapped with the bottom side of the spacer 203. In this case, because the spacer 203 raises the whole display module in height, and because the spacer 203 completely covers the second area 2012, the thickness of the bottom border of the whole middle frame is uniform, and thus when a display apparatus similar to the telephone watch is manufactured, manufacturing difficulty of the middle frame can be reduced while the narrow border is realized.

Display Apparatus B;

As shown in FIG. 11, the display apparatus B is a mobile phone, in which a camera and a handset need to be installed on an upper border of the mobile phone, and thus the spacer can be provided on the upper border of the mobile phone to reduce a width of a lower border.

As shown in FIG. 11, a panel at an upper side of FIG. 11 is a schematic plan view of a mobile phone, and a panel at a lower side of FIG. 11 is a schematic sectional view of the mobile phone in an A-A direction. As shown in FIG. 11, the mobile phone includes a rectangular cover plate 201, a display panel 202 and a spacer 203. The spacer 203 is a rectangle with a hollow interior, and a thickness of a housing 2034 of the spacer 203 can be 0.2 mm to 0.8 mm, which can be selected according to actual needs.

The outer side of the spacer 203 can be aligned with the outer side of the cover plate, that is, on a same vertical line, and the inner side of the spacer is closely attached to a side edge of the display panel and a thin layer of sealant can be filled between them so as to isolate water vapor.

As shown in FIG. 11, the spacer 203 can also have a certain stacked area with the display panel 202, that is, the orthogonal projection of the spacer 203 on the cover plate 201 can have an overlapping area with the orthogonal projection of the display panel 202 on the cover plate 201, so that the spacer can function to support the display panel.

As shown in FIG. 11, there are no spacer 203 in an upper side area and left and right side areas of the cover plate, but only the spacer exist in a lower side area of the cover plate. However, since the height of the spacer is greater than the height of the display panel, in this case, in order to ensure that a bottom of the display apparatus is flush after the middle frame is connected to the display module, the thickness of the bottom border of the middle frame needs to be adapted to a height of a lower side of the display module, that is, a thickness of the bottom border of the middle frame in the upper side area, the left side area and the right side area is greater than a thickness of the bottom border in the lower side area, namely the thickness of the bottom frame of the middle frame is non-uniform.

Correspondingly, an assembly method of the display module described above is further provided in the present disclosure, so as to assemble the display module. First, a cover plate, a display panel and a spacer 203 can be provided. As described in the above embodiments, the cover plate includes a first area and a second area adjacent to the first area, and assembling is made in following steps 1 and 2.

In step 1, the display panel is attached to the first area.

In step 2, the spacer 203 is attached to a part or all of the second area. A height of the spacer 203 is greater than a height of the display panel. The spacer includes a housing and an injection cavity recessed into the housing, and the injection cavity is close to the display panel. The injection cavity is filled with an injection material.

A space cavity is provided at a side of the display panel close to the spacer, and the space cavity is filled with the injection material.

In step 2, the spacer 203 can be closely attached to the display panel by using a fixture. Specifically, the cover plate attached with the display panel can be place into the fixture. Then, the spacer 203 is placed into the fixture so that the spacer 203 is attached to all of the second area.

As described in the above embodiments, the spacer 203 includes the housing 2034 and the injection cavity 2033 located inside the housing 2034. Accordingly, after the housing 2034 of the spacer 203 is attached to a part or all of the second area, the injection cavity can be filled with the injection material through an injection hole provided in the housing 2034.

Figure 12:
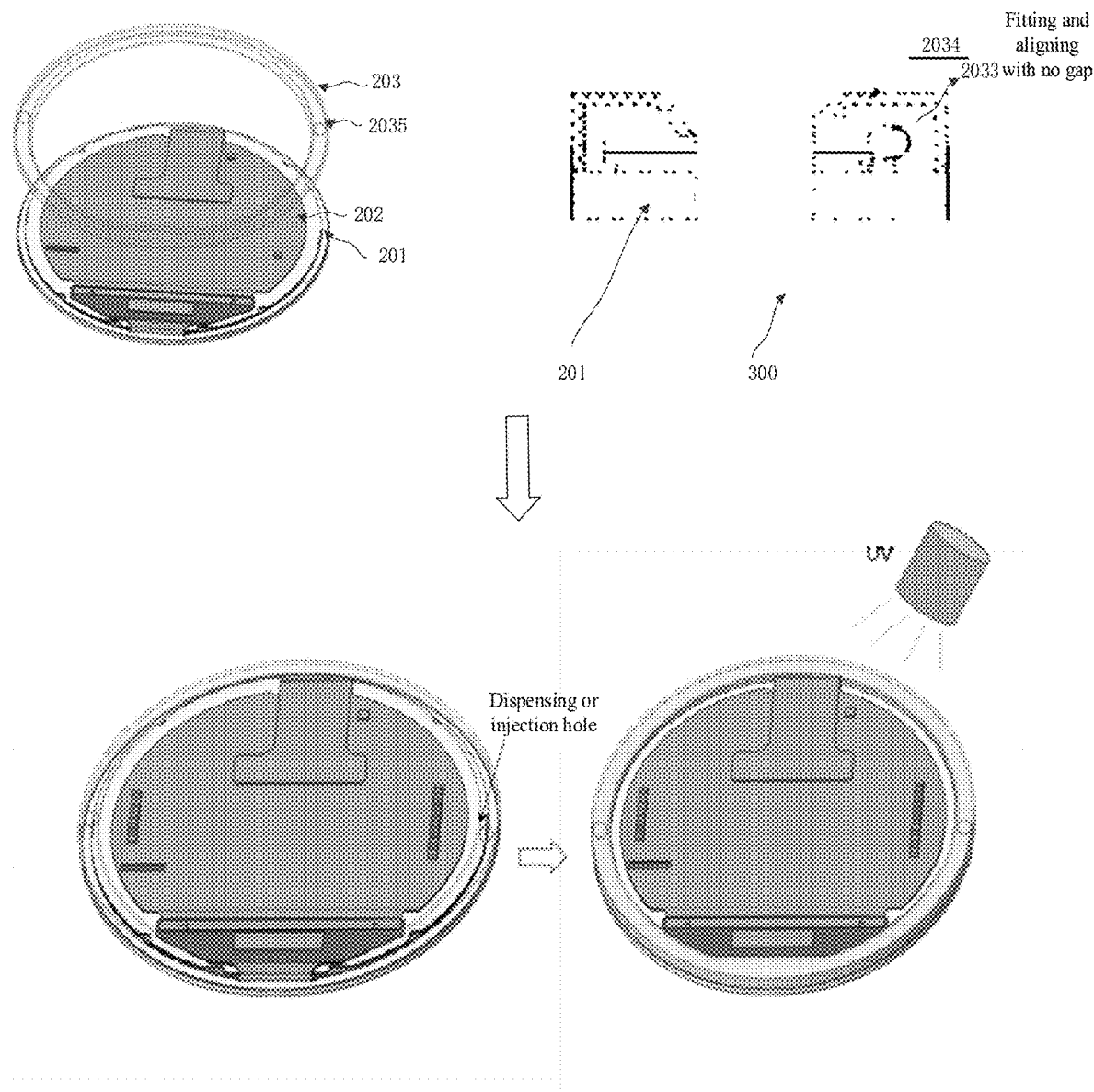
FIG. 12 schematically shows an assembly flow chart of a watch module according to the present disclosure.

An assembly process of the display module of the present disclosure is schematically illustrated by taking a watch display module as the display module as an example. As shown in FIG. 12, an assembly flow chart of a watch module is shown, in which the spacer 203 is a transparent ring as large as the glass cover 201, as shown in FIG. 12.

Firstly, after the display panel 202 is attached to the glass cover plate 201, the obtained module is placed into the fixture, and the fixture 300 is 0.05 mm greater than a single side of the glass cover plate 201, and the fixture 300 is higher than the glass cover plate 201 and the display panel 202. Then, the spacer 203 (the transparent ring) is placed into the fixture 300 to achieve zero-gap fit. At this time, since the transparent ring has the injection cavity recessed into the housing, that is, there is a space cavity between the transparent ring and the display panel, so that the transparent ring cannot directly contact the display panel, and damage to the display panel can be avoided.

Then, an organic material is injected into the internal injection cavity of the transparent ring through two small injection holes on an upper side of the transparent ring in an injection molding mode, because the injection material is viscous and flexible during injection, and it still does not cause damage to the display panel. Then, the module is irradiated under ultraviolet light (UV) to cure the injection material.

After curing, the transparent ring can be completely bonded to the glass cover plate and the display panel, which provides strong support for the whole display module; and the display module is raised by the transparent ring at its periphery, and is strong enough to be directly connected to the middle frame of a whole machine.

In this way, there is no need to consider an interference distance of 0.6 mm between the middle frame and the display panel, and the stacked area between the middle frame and the spacer 203 can also exceed the display panel, thus realizing the narrow border design.

Then, the middle frame can be connected to the outer side of the spacer and the outer side of the display panel, and the bottom border of the middle frame can be overlapped with the bottom of the spacer, thereby supporting the whole display module.

Based on a same inventive concept, an electronic device is further provided in the present disclosure, which includes the display apparatus described above or includes the display module described above.

The various embodiments in this specification are described in a progressive manner, and each embodiment focuses on the differences from other embodiments. The same and similar parts between each embodiment can be referred to each other.

Finally, it should be noted that in this specification, relational terms such as first and second are only used to distinguish one entity or operation from another entity or operation, and do not necessarily require or imply any actual relationship or order between these entities or operations. Moreover, the terms "including", "comprising", or any other variation thereof are intended to encompass non-exclusive inclusion, such that a process, method, commodity, or device that includes a series of elements not only includes those elements, but also includes other elements that are not explicitly listed, or also includes elements inherent to such process, method, commodity, or device. Without further limitations, the elements limited by the statement "including one . . . " do not exclude the existence of other identical elements in the process, method, commodity, or device that includes the said elements.

The above provides a detailed introduction to a display module, a display apparatus, and an assembly method of the display module provided in the present disclosure. Specific examples are applied in this specification to explain the principles and implementation methods of the present disclosure. The above examples are only used to help understand the method and core idea of the present disclosure. Meanwhile, for persons skilled in the art, there may be changes in specific implementation methods and application scope based on the ideas disclosed in the present disclosure. In summary, the content of this specification should not be understood as a limitation on the present disclosure.

Persons skilled in the art, after considering the specification and practicing the invention disclosed herein, will easily come up with other embodiments of the present disclosure. The present disclosure aims to cover any variations, uses, or adaptive changes of the present disclosure, which follow the general principles of the present disclosure and include common knowledge or customary technical means in the field of technology that are not disclosed in the present disclosure. The specification and embodiments are only considered exemplary, and the true scope and spirit of the present disclosure are indicated by the following claims.

It should be understood that the present disclosure is not limited to the precise structure described above and shown in the drawings, and various modifications and changes can be made without departing from its scope. The scope of the present disclosure is limited only by the attached claims.

The term "one embodiment," "an embodiment," or "one or more embodiments" referred to in this specification means that specific features, structures, or features described in conjunction with the embodiments are included in at least one embodiment of the present disclosure. Furthermore, please note that the example of the term "in one embodiment" may not necessarily refer to the same embodiment.

In the specification provided here, a large number of specific details are explained. However, it can be understood that the embodiments of the present disclosure can be practiced without these specific details. In some examples, well-known methods, structures, and techniques are not shown in detail to avoid blurring the understanding of this specification.

In the claims, any reference symbol between parentheses should not be constructed as a limitation on the claims. The word "comprising" does not exclude the presence of components or steps not listed in the claims. The word "a/an" or "one" before a component does not exclude the existence of multiple such components. The present disclosure can be achieved through hardware comprising several different components and through appropriately programmed computers. Among the unit claims that list several devices, several of these devices can be specifically embodied through the same hardware item. The use of words such as first, second, and third does not indicate any order. These words can be interpreted as names.

Finally, it should be noted that the above embodiments are only used to illustrate the technical solution of the present disclosure, and not to limit it. Although detailed explanations of the present disclosure have been provided with reference to the aforementioned embodiments, those skilled in the art should understand that they can still modify the technical solutions recorded in the aforementioned embodiments, or equivalently replace some of the technical features therein. And these modifications or replacements do not make the essence of the corresponding technical solutions deviate from the spirit and scope of the technical solutions of the embodiments in the present disclosure.

The invention claimed is:

1. A display module, comprising:
   a cover plate, wherein a side of the cover plate comprises a first area and a second area adjacently connected to the first area;
   a display panel attached to the first area; and
   a spacer attached to a part or all of the second area, wherein a height of the spacer is greater than a height of the display panel;
   wherein the spacer comprises a housing and an injection cavity recessed into interior of the housing, the injection cavity is close to the display panel and the injection cavity is filled with an injection material; and
   a space cavity is provided at a side of the display panel close to the spacer, and the space cavity is filled with the injection material.

2. The display module according to claim 1, wherein the spacer is closely attached to the display panel.

3. The display module according to claim 1, wherein an orthogonal projection of the spacer on the cover plate covers the second area in a case that the spacer is attached to all of the second area.

4. The display module according to claim 1, wherein an outer side of the spacer is aligned with an edge outer side of the cover plate.

5. The display module according to claim 1, wherein the housing is made of a transparent material.

6. The display module according to claim 1, wherein the injection material comprises at least one of epoxy resin, polyurethane and silicone.

7. The display module according to claim 1, wherein the housing is provided with at least one injection hole for filling the injection cavity with the injection material.

8. The display module according to claim 1, wherein a thickness of the housing is 0.2 mm to 0.8 mm.

9. The display module according to claim 1, wherein the cover plate is rectangular, and the spacer is attached to the second area at a first side and/or the second area at a second side; wherein the first side and the second side are different sides.

10. The display module according to claim 1, wherein the cover plate is a circular glass cover plate, the spacer is in a form of a circular ring, and an outer diameter of the circular ring is the same as a radius of the glass cover plate.

11. The display module according to claim 1, wherein a sealant is filled between the spacer and the display panel.

12. The display module according to claim 1, wherein the display panel comprises at least one of an OLED display panel, an LCD display panel and an LED display panel.

13. An assembly method of a display module, comprising:
   providing a cover plate, wherein a side of the cover plate comprises a first area and a second area adjacent to the first area;
   attaching a display panel to the first area; and
   attaching a spacer to a part or all of the second area; wherein a height of the spacer is greater than a height of the display panel, the spacer comprises a housing and an injection cavity recessed into interior of the housing, the injection cavity is close to the display panel, and the injection cavity is filled with an injection material; and a space cavity is provided at a side of the display panel close to the spacer, and the space cavity is filled with the injection material.

14. The method according to claim 13, wherein the attaching the spacer to the part or all of the second area comprises:
    placing the cover plate attached with the display module into a fixture; and
    placing the spacer into the fixture, so that the spacer is attached to all of the second area.

15. The method according to claim 13, wherein the attaching the spacer to the part or all of the second area comprises:
    attaching the housing to the part or all of the second area; wherein the injection cavity is close to the display panel; and
    filling the injection cavity with the injection material through an injection hole provided in the housing.

16. A display apparatus, comprising a middle frame and the display module according to claim 1; wherein the display module is installed on the middle frame, and the middle frame is configured for supporting the cover plate, the spacer and the display panel.

17. The display apparatus according to claim 16, wherein the middle frame comprises:
    a first frame body located at a side of the spacer away from the cover plate, wherein an orthographic projection of the first frame body on the cover plate overlaps with an orthographic projection of the display panel on the cover plate.

18. The display apparatus according to claim 16, wherein the middle frame comprises:
    a second frame body closely attached to an outer side of the spacer and a first edge outer side of the cover plate; and
    a third frame body closely attached to a second edge outer side of the cover plate and having a gap with the display panel; wherein the second edge outer side is an edge outer side except the first edge outer side.

* * * * *